(12) United States Patent    (10) Patent No.:    US 12,609,705 B2

Akbar    (45) Date of Patent:    Apr. 21, 2026

(54) SYSTEMS AND METHODS FOR REALIZING HIGH-SPEED LOW-POWER WIRELINE TRANSCEIVERS

(71) Applicant: Fatemeh Akbar, Tehran (IR)

(72) Inventor: Fatemeh Akbar, Tehran (IR)

(73) Assignee: Sharif University of Technology, Tehran (IR)

( * ) Notice: Subject to any disclaimer, the term of this patent is extended or adjusted under 35 U.S.C. 154(b) by 95 days.

(21) Appl. No.: 18/600,748

(22) Filed: Mar. 10, 2024

(65) Prior Publication Data

US 2025/0286556 A1    Sep. 11, 2025

(51) Int. Cl.
*H03K 23/64*    (2006.01)
*H03K 5/05*    (2006.01)

(52) U.S. Cl.
CPC .............. *H03K 23/64* (2013.01); *H03K 5/05* (2013.01)

(58) Field of Classification Search
CPC ........ H03K 23/64; H03K 5/05; H04L 25/028; H04L 25/0264; H04L 25/4917; H04B 1/02
See application file for complete search history.

(56) References Cited

U.S. PATENT DOCUMENTS

| | | | |
|---|---|---|---|
| 8,121,205 B1 | 2/2012 | Zheng et al. | |
| 9,900,186 B2 | 2/2018 | Shokrollahi et al. | |
| 12,401,553 B2 * | 8/2025 | Chun ........................ | G06F 5/06 |
| 2004/0131126 A1 * | 7/2004 | Chung ................... | H04L 27/04 |
| | | | 375/268 |

OTHER PUBLICATIONS

F. Akbar and K. Gharibdoust, "An Orthogonal Pulse Amplitude Modulation Signaling for High-Speed Wireline Communications," 2023 IEEE International Symposium on Circuits and Systems (ISCAS), Monterey, CA, USA, 2023 (Conference Date May 2023, Date added to IEEE Xplore Jul. 2023), pp. 1-5. (Year: 2023).*
Wendemagegnehu T. Beyene, and Amir Amirkhany, 'Controlled Intersymbol Interference Design Techniques of Conventional Interconnect Systems for Data Rates Beyond 20 Gbps', "IEEE Transactions on Advanced Packaging, vol. 31, No. 4, Nov. 2008" [https://ieeexplore.ieee.org/document/4520266].

(Continued)

*Primary Examiner* — Sophia Vlahos

(57)    ABSTRACT

A method for creating and transmitting an encoded data stream comprises receiving a data stream that includes a number M of same-rate data streams $x_1, x_2, \ldots, x_M$, where each data stream in the M same-rate data streams has an ordered number of bits with each bit having a period of $T_{sym}$ and a clock pulse signal that includes a plurality of pulses where a time duration of each pulse in the plurality of pulses corresponds to $T_{sym}/M$. A number M of pulse signals is generated, and an encoded data stream is created by multiplying a value of one bit of each data stream in the ordered number M of data streams by a value of a corresponding of a pulse signal in the ordered number M of orthogonal pulse signals to provide M results, and summing the M results. Once summed, the encoded data stream can be transmitted.

20 Claims, 9 Drawing Sheets

(56)          References Cited

OTHER PUBLICATIONS

K. Gharibdoust, A. Tajalli, and Y. Leblebici, "A 4×9 Gb/s 1pJ/b
hybrid NRZ/multi-tone I/O with crosstalk and ISI reduction for
dense interconnects," IEEE J. Solid-State Circuits, vol. 51, No. 4,
pp. 992-1002, Apr. 2016 [https://ieeexplore.ieee.org/abstract/document/
7368875].
H. Park et al., "30-Gb/s 1.11-pJ/bit single-ended PAM-3 transceiver
for high-speed memory links," IEEE J. Solid-State Circuits, vol. 56,
No. 2, pp. 581-590, Feb. 2021 [https://ieeexplore.ieee.org/document/
9141289].

* cited by examiner

201

202

Receive data stream
1101

Generate M orthogonal clock pulse signals
1102

Create an encoded data stream
1103

Transmit the encoded data stream
1104

Receive encoded data stream
1105

Equalize the received data stream
1106

Extract M orthogonal clock pulse signals
1107

Decode the data stream
1108

Output the decoded data stream
1109

SYSTEMS AND METHODS FOR REALIZING HIGH-SPEED LOW-POWER WIRELINE TRANSCEIVERS

BACKGROUND

As technology advances, the demand for high data rates in wireline communication systems has increased, and this increased demand has been underscored by emerging technologies such as 5G NR, internet of things (IoT), artificial intelligence, and machine learning in recent years. With regard to wireline transceivers, wireline transceivers with various communication standards have been largely implemented using CMOS technology. But while the existing wireline communication standards and CMOS technology have been developed to fit in with higher data rates, the interface connecting the transceiver blocks has not improved at the same pace, thereby introducing a large loss when used in the high data-rate systems required by modern technologies.

FIG. 1 shows the general block diagram of a wireline transceiver. In a wireline communication system, the transmitter (Tx) block serializes multiple low-speed digital data-streams, using a serializer 101 clocked by a phase locked loop (PLL) 102, into a single high-speed data-stream. Following serialization, the signal power will be adjusted, using an output driver 103, to an optimal level, and it is sent through a wire (104) toward the receiver. The Tx output driver is responsible for maintaining signal integrity, meeting impedance requirements, and facilitating reliable communication between the transmitter and the receiver. The receiver (Rx) block ideally receives the high-speed data-stream and de-serializes it back into the original low-speed digital data streams. The loss of interconnect, however, increases with frequency and tends to degrade the signal quality on the receiver side. Hence, an equalization scheme is used on the receiver side to provide as close to an error free reception as can be provided. To do this, a receiver block, in general, receives the high-speed data-stream, equalizes it using Rx-equalizer 105 comprised of continuous time linear equalizer (CTLE) and decision feedback equalizer (DFE) s to achieve a high reception quality, and de-serializes it using a deserializer 106 into multiple low-speed data-streams for digital post processing purposes. The necessary clock reference for the Rx DFE and deserializer to correctly deserialize the incoming data is provided by the clock and data recovery (CDR) circuit 107 which extracts a stable clock signal from the incoming data stream.

Typically, complexity of the required equalization schemes increases with the transmitted data rate. This is because with increasing data rate, the transmitted signal occupies a larger bandwidth, and the increased loss of the interface (104) at higher frequencies results in a greater waste of transmitted spectrum energy, leading to degradation in the received signal quality.

Several works focusing on spectrally efficient signaling methods have been reported. These methods have been largely based on multi-level pulse amplitude modulation (PAM) rather than conventionally utilized non-return-to-zero (NRZ) signaling which is shown in FIG. 2 at 201.

In a pulse amplitude modulation signaling with "X" level (PAM-X), log 2(X) number of bits are mapped to a specific voltage level which is transmitted through the wire as shown in FIG. 2 for X=4 at 202. A PAM-X (usually X=3 or 4) signaling provides higher data rates and improved spectral efficiency compared to NRZ; however, it is more susceptible to noise due to its multiple amplitude levels. It also requires complex equalization schemes, resulting in higher power consumption per bit, particularly in high-speed communication systems.

As shown above, various techniques for transferring data are known in the art. For example, as described in Wendemagegnehu T. Beyene, and Amir Amirkhany, 'Controlled Intersymbol Interference Design Techniques of Conventional Interconnect Systems for Data Rates Beyond 20 Gbps', "IEEE TRANSACTIONS ON ADVANCED PACKAGING, VOL. 31, NO. 4, November 2008" [https://ieeexplore.ieee.org/document/4520266], Non-Return-to-Zero (NRZ) is a basic signaling which maps logics "0" and "1" to different voltage levels, V1 and V2. It has an operational throughput of only one bit per symbol and a Nyquist frequency of one half of the data-rate. NRZ signaling is not spectrally efficient and is not a good choice for today's high-speed wireline communications, as it tends to suffer more from interface loss, resulting in an unacceptable level of intersymbol interference (ISI).

Duobinary (Dicode) and modified Duobinary (modified Dicode) signaling, as described in Wendemagegnehu T. Beyene, and Amir Amirkhany, 'Controlled Intersymbol Interference Design Techniques of Conventional Interconnect Systems for Data Rates Beyond 20 Gbps', "IEEE TRANSACTIONS ON ADVANCED PACKAGING, VOL. 31, NO. 4, November 2008", utilize another encoding approach that helps improve the spectral efficiency of the transmitted signal compared to NRZ. In Duobinary signaling, each binary data bit is encoded into three possible signal levels: $-V1$, 0, or V1. This encoding is achieved by adding the current bit to the previous bit. If the current bit is the same as the previous bit, the signal level remains the same (either $-V1$ or V1), otherwise, the signal level becomes 0. In modified Duobinary, the encoding rules are similar to those of standard duobinary, but with a modification: If the current bit is different from the previous bit, the signal level not only becomes 0 but also inverts polarity (changes from $+1$ to $-1$ or vice versa). This modification aims to further improve the signal's immunity to noise and intersymbol interference (ISI) while maintaining relatively efficient use of bandwidth. Duobinary and modified Duobinary have a Nyquist frequency of data-rate/4; however, these signaling methods have operational throughputs of only one bit per symbol and also lead to error propagation in communication systems.

Another known signaling approach, which is described in K. Gharibdoust, A. Tajalli, and Y. Leblebici, "A 4×9 Gb/s 1 pJ/b hybrid NRZ/multi-tone I/O with crosstalk and ISI reduction for dense interconnects," IEEE J. Solid-State Circuits, vol. 51, no. 4, pp. 992-1002, April 2016 [https://ieeexplore.ieee.org/abstract/document/7368875], called Hybrid NRZ (Non-Return-to-Zero) multitone signaling, combines the elements of non-return-to-zero encoding with multitone (multilevel) modulation to provide a throughput of 2 bits per symbol and achieve a more efficient data transmission over a communication channel. Multitone modulation is based on using multiple signal frequencies, each of which can represent different combinations of bits. In hybrid NRZ multitone signaling, rather than using a simple binary mapping to frequencies, found in traditional multitone modulation, signal levels within each bit period are adjusted following an NRZ-style modulation pattern to represent the data. This approach, however, is typically useful only for short-reach interfaces that experience losses and variations in their transfer coefficients.

In the literature, various spectrally efficient signaling methods based on a pulse amplitude modulation (PAM) scheme are disclosed that enable high-speed wireline communications. (See, e.g., U.S. Pat. No. 8,964,818.) For example, a 4-level pulse amplitude modulation (PAM-4) is disclosed in U.S. Pat. No. 8,964,818 where four pulse levels are used to transmit the symbols "00," "01," "10," and "11,". PAM-4 provides a 2 bit per symbol throughput and consequently a two-times higher data rate for the same bandwidth (compared to NRZ). PAM-4 signaling also provides a Nyquist frequency equal to the data rate divided by four, which is considered spectrally efficient. Because this signaling requires four voltage levels, however, it has lower voltage margins for transmitting each symbol, and it is more sensitive to system non-idealities such as noise and jitter. It also inherently suffers from larger data-dependent jitter.

In H. Park et al., "30-Gb/s 1.11-pJ/bit single-ended PAM-3 transceiver for high-speed memory links," IEEE J. Solid-State Circuits, vol. 56, no. 2, pp. 581-590, February 2021 [https://ieeexplore.ieee.org/document/9141289], PAM-3 signaling has been disclosed to increase voltage margin and reduce sensitivity to non-idealities (compared to PAM-4) in the communication link's performance. PAM-3 requires three voltage levels and provides a throughput of 1.5 bit per symbol, and its Nyquist frequency is equal to the data rate divided by three. Compared to PAM-4, which has a throughput of 2 bits per symbol, PAM-3 has a lower throughput.

Chordal signaling and its implementation methods, introduced in U.S. Pat. No. 9,900,186, have also been used to improve transmission of signals. In this approach, N bits are encoded onto N+1 wires. For N=3, this signaling is referred to as ENRZ, which has a throughput of 1.5 bit per symbol for the same aggregate data rate over 4 wires. ENRZ has a Nyquist frequency of data rate divided by three (similar to PAM-3). However, it requires four physical wires for encoding each symbol, thus making it more sensitive to wire-to-wire differences compared to pulse amplitude modulation (PAM) signaling techniques, which utilize a single differential pair for data encoding.

Additionally, a patent titled "Extended non-return-to-zero channel signaling (U.S. Pat. No. 8,121,205) also presents methods and circuits for NRZ wide signaling. In this signaling, N+1 voltage levels are used to transmit N bits per symbol. Each bit is an NRZ sequence with a bit rate of R and a bandwidth requirement of approximately R Hz. In this signaling, the combined bit rate is N*R, but since the sub-sequences are not correlated, the required bandwidth remains nearly R Hz. This signaling improves throughput by a factor of N and provides a throughput of N bits per symbol and a Nyquist frequency of data rate divided by N, but at the cost of increasing the number of voltage levels to N+1 and reducing the existing horizontal margin by a factor of N for transmission of each symbol. This results in a reduction in voltage and clock sampling margin by a factor of N, thereby increasing sensitivity to voltage noise and jitter.

SUMMARY

Embodiments disclosed herein relate to systems and methods for efficient data transmittal. In particular, embodiments are related to a new spectrally efficient signaling scheme that allows for low-complexity and low-power realization of high-speed wireline (wired) transceivers. Such a scheme can be used in a variety of contexts including (by way of example only), datacenter interconnects, chip-to-chip interconnects, serializers (SER), and de-serializers (DES).

Additionally, reducing the power consumption and complexity of high-speed wired transceivers is one of today's most critical demands that cannot be fully satisfied using PAM signaling schemes. The proposed signaling, which can be implemented with simple and low-power integrated circuits, utilizes a new structure to enable high-speed data transmission and improved signal reception quality while reducing structural complexity and power consumption in the transceiver system.

In an embodiment, the applicable data is modulated with multiple orthogonal clock pulse signals and transmitted. As a result of this process, clock pulse information is indirectly included in each unit of transmitted data (called herein, a "symbol"), eliminating the need for complex clock and data recovery (CDR) circuits and making it possible to create a low-power and high-quality CDR. In an embodiment, the frequency spectrum of the transmitted signal is adjusted in a way that reduces distortion when passing through common channels, simplifying the required equalizer structure and reducing power consumption. Due to its reduced power consumption and simplicity, the disclosed signaling protocol can include the benefits of contributing to cost savings and environmental sustainability, particularly in data centers and any other high-speed wireline communication system. Embodiments of the disclosed signaling protocol may extend to a wide range of wired communications scenarios, including (but not limited to) data center server-to-server communication, image sensor communication with central automotive processors, and central computer processors communicating with peripheral memory and graphics cards.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
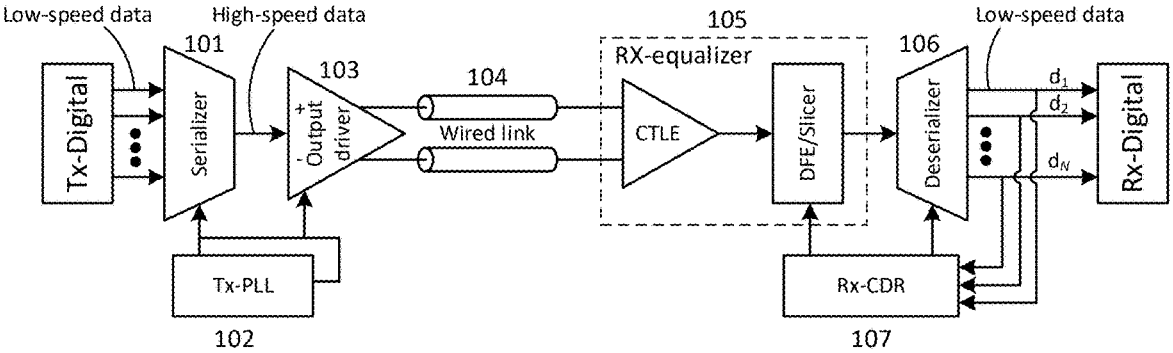
FIG. 1 is a block diagram of certain components of a wireline transceiver.
Figure 2:
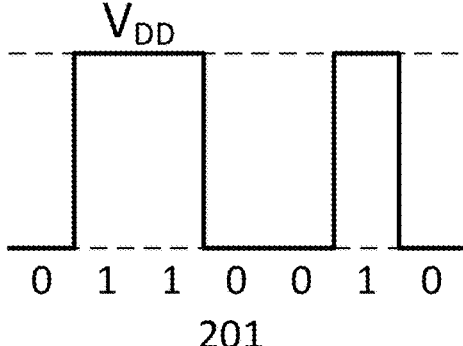
FIG. 2 is a diagram of an example of known NRZ and an example of known PAM-4 signaling.
Figure 2:
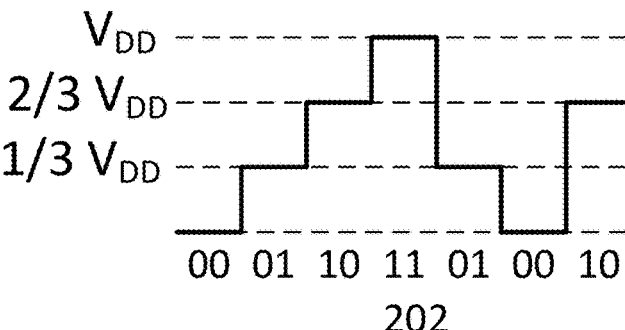

As described above, systems and methods for a signaling scheme are disclosed that can be used in wired communication in a way that provides low-complexity and low-power realization of wired transceivers. Embodiments can enable the transmission of data at high rates while reducing the power consumption of wired transceivers and improving signal reception quality, particularly in terms of low sensitivity to noise and jitter.

Embodiments of the invention use clock pulse signals that are orthogonal within the time duration (period) of one unit of information (referred to as a "symbol"), $T_{sym}$, for pulse amplitude modulation. In an embodiment, the incoming data stream, x, with a bit period of $$\frac{T_{sym}}{M}$$

is split into a number M of same-rate data streams, $x_k$ where $k \in \{1, 2, \ldots, M\}$, with a bit period of $T_{sym}$. These M data streams are then multiplied by orthogonal clock pulse signals $\{p_1, p_2, \ldots, p_M\}$, and the resulting multiplied signals are then added to generate the encoded data stream y. The general equation for the complete encoded data stream can be represented by the following equation:

$$y(t) = \sum_{k=1}^{M} x_k(t) \times p_k(t), \qquad \text{(Equation (1))}$$

where t denotes time. Considering the discrete-values nature of the data streams $x_k$, clock pulse signals $p_k$, and the encoded data stream y, Equation (1) can be rewritten as the following equation:

$$y(n) = \sum_{k=1}^{M} x_k(r) \times p_k(n), \qquad \text{(Equation (2))}$$

$$n, r \in \{0, 1, 2, \ldots\}, \quad k \in \{1, 2, \ldots, M\}, \quad r = \left\lfloor \frac{n}{M} \right\rfloor$$

In Equation (2), n denotes the bit number for the encoded data stream y and the pulse number for the orthogonal modulating clock pulse signals $p_k$. Moreover, r represents the bit number for the data stream $x_k$ and is equal to the integer part of $$\left(\frac{n}{M}\right).$$

y(n) is the value of the nth bit of the encoded data stream, $p_k(n)$ is the value of the nth pulse of the kth modulating clock pulse signal, and $x_k(r)$ is the value of the rth bit of the data stream $x_k$ which is equal to x(Mr+k−1). The bit period of encoded data stream y and the time duration of each pulse for the orthogonal modulating clock pulse signals $p_k$ equal $$\frac{T_{sym}}{M}.$$

In Equation (1), the modulating clock pulse signals, denoted as $p_k$, have logical levels "−1" or "+1" and are orthogonal within a symbol period ($T_{sym}$), satisfying Equation (3), below.

$$\int_{t_0}^{t_0+T_{sym}} p_j(t) \times p_k(t)dt = 0, \qquad \text{(Equation (3))}$$

$$j, k \in \{1, 2, \ldots, M\}, j \neq k, p_k \in \{-1, +1\}$$

Considering that Equation (2) is a linear sum of M signals $x_k \times p_k$, where $p_k$ and $x_k$ have logical levels "−1" or "+1," the output of this equation has M+1 voltage levels {−M, −M+2, −M+4, ..., M−4, M−2, M}. Due to the orthogonality of $p_1$, $p_2$, ..., and $p_M$, the data streams $x_1$, $x_2$, ..., and $x_M$ can be concurrently decoded on the receiver side by multiplying the received signal by $p_1$, $p_2$, ..., and $p_M$, respectively, and integrating the result over one $T_{sym}$.

Figure 3:
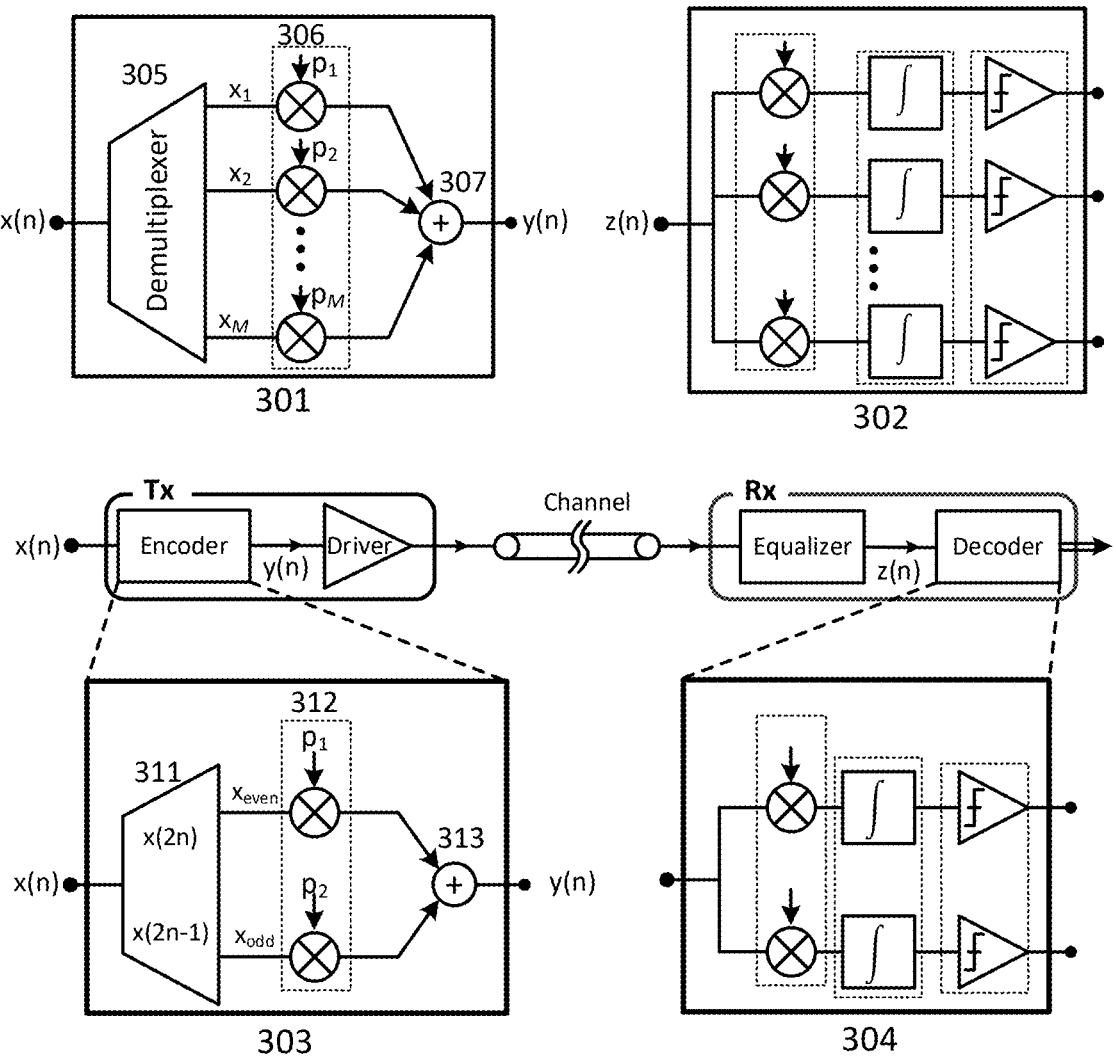
FIG. 3 is a high-level block diagram of a transceiver, according to an embodiment.

The block diagram for a wired transceiver that implements the signaling of equation (2) is shown in FIG. 3. Within the encoder block 301, using a demultiplexer circuitry 305, the digital data x(n) with a bit period of $T_{sym}/M$ is divided into M data streams, $\{x_1, x_2, \ldots, x_M\}$ each with a bit period of one $T_{sym}$. The data streams $\{x_1, x_2, \ldots, x_M\}$ are then multiplied, using a set of multipliers 306, by clock pulse signals $\{p_1, p_2, \ldots, p_M\}$ which are orthogonal within one $T_{sym}$ (as shown in equation (3)). The resulting products are then summed, using an adder 307, to generate the encoded data stream y(n), as specified in Equation (2).

Within the decoder block 302, the data streams $x_1$, $x_2$, ..., $x_M$ are concurrently obtained by multiplying the signal input to the decoder, z(t) which can also be represented by its discrete-value form z(n), by $p_1$, $p_2$, ..., $p_M$, respectively 308, integrating the results over one $T_{sym}$ 309, and passing the integrators' outputs through slicers 310, as represented by the following equation:

$$x_k(r) = \int_{rT_{sym}}^{(r+1)T_{sym}} z(t) \times p_k(t)dt \qquad \text{(Equation (4))}$$

$$k \in \{1, 2, \ldots, M\}$$

This yields a throughput of M bits per one $T_{sym}$ considering that k varies from 1 to M in equation (4).

In the special case where M=2, the proposed signaling simplifies as follows $$y(n) = x_{even}(r) \times p_1(n) + x_{odd}(r) \times p_2(n) \qquad \text{(Equation (5))}$$

Within the encoder block 303, using a demultiplexer 311, the digital data x(n) with a bit period of $0.5T_{sym}$ is divided into two data streams, $x_{even}(r)=x(2r)$ and $x_{odd}(r)=x(2r+1)$, each with a bit period of one $T_{sym}$. The data streams $x_{even}$ and $x_{odd}$ are then multiplied, using multipliers 312, by orthogonal clock pulse signals $p_1$ and $p_2$, and the resulting products are then summed, using an adder 313, to generate the encoded data stream y(n), which is given by Equation (5).

Figure 4:
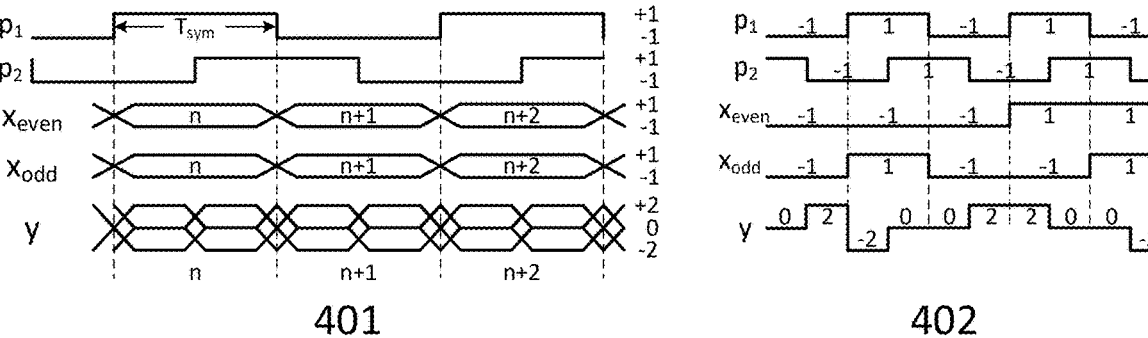
FIG. 4 is a graphical representation of the voltage levels of the transmitted stream, y(n), and how they change with each transition of clock pulse signals, $p_1$ and $p_2$, according to an embodiment.

In Equation (5), the orthogonal modulating clock pulse signals $p_1$ and $p_2$, as well as the data streams $x_{even}$ and $x_{odd}$, have logical levels "−1" or "+1." Thus, the data stream y(n) has three voltage levels, as depicted in FIG. 4. As shown in FIG. 4, the voltage levels of y(n) change with each transition of $p_1$ and $p_2$. In an embodiment, the transitions, which are independent of the data in y(n), enable a high-quality clock and data recovery (CDR) at the receiver. Thus, in an embodiment, a CDR can be implemented with lower structural complexity and better quality compared to CDRs for known methods PAM-4 and PAM-3.

Figure 5:
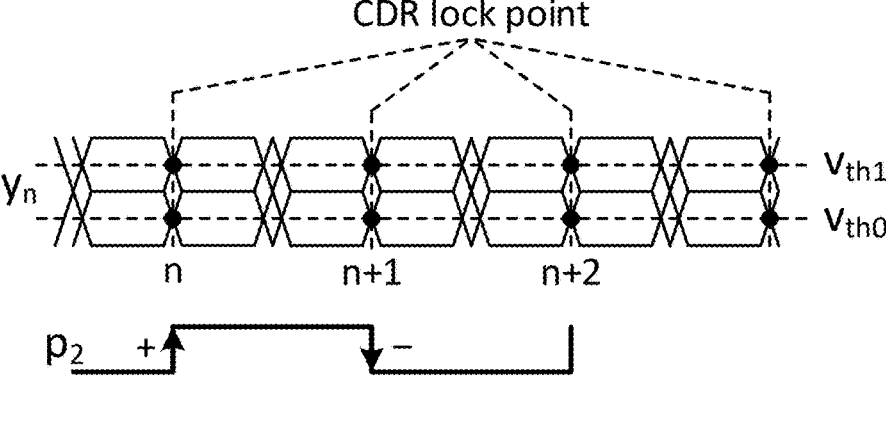
FIG. 5 is a graphical representation of defined time points, according to an embodiment.

In an embodiment, as can be seen in FIG. 4 at 401, each transmitted symbol has a footprint of a rising or falling edge of the clock pulse. At 402, a graphical representation of an embodiment is shown on the transmission side. In this example, the bit stream for x(n) is "0001001011", and a voltage value of "−1" is assigned to each bit that has a voltage value of zero;

FIG. 5 is a representation of defined time points referred to as "CDR lock points," according to an embodiment. These are the moments in time when the receiver's CDR (Clock and Data Recovery) must lock onto and extract the clock edges. As can be seen by the presence of such a footprint from the rising or falling clock edges (see the clock pulse signal $p_2$ in FIG. 5) in each transmitted symbol at the receiver side, the receiver always has knowledge of the clock pulse's state, regardless of the transmitted data type or value.

One skilled in the art will appreciate that, in the proposed signaling method, good jitter tracking capability of the forwarded clock architecture is preserved with no need for an additional cable/wire interface, as the clock edges are embedded within the units of data. The presence of clock pulse in each transmitted symbol leads to improved efficiency and performance of clock and data recovery (CDR) circuits at the receiver.

Figure 6:
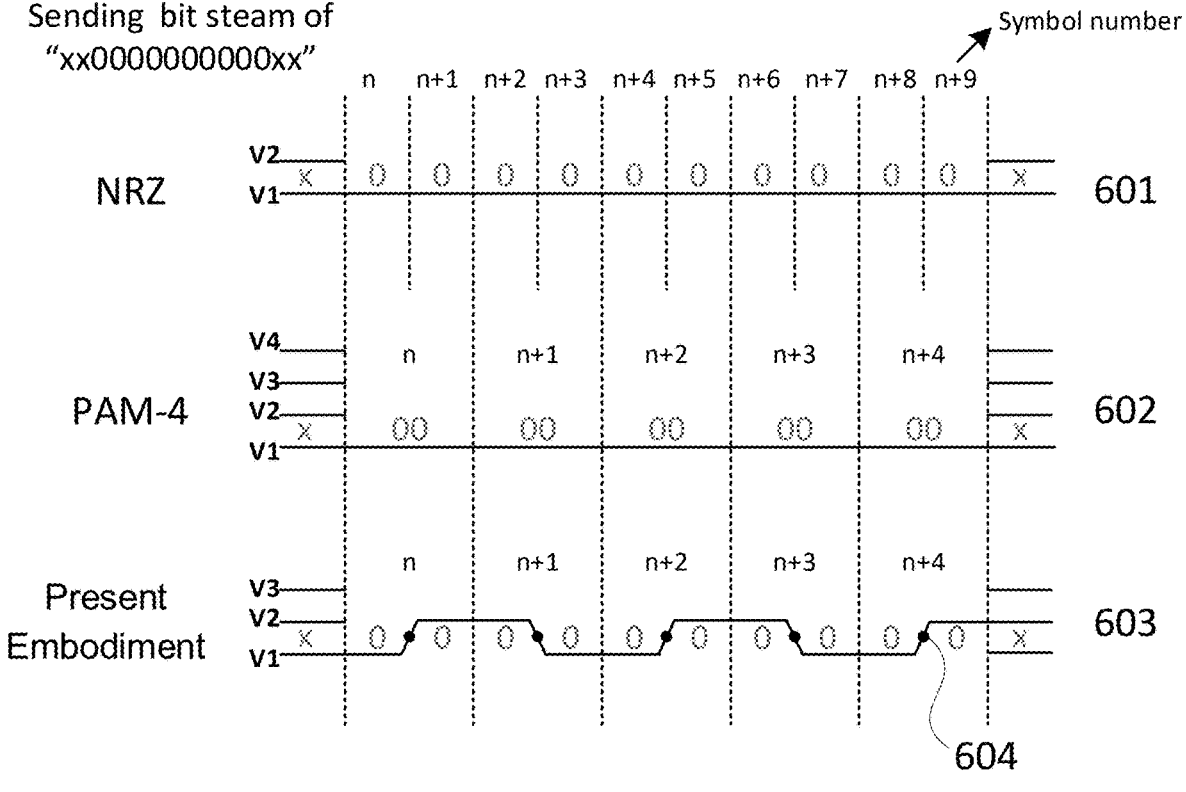
FIG. 6 is a graphical comparative representation of a bitstream comparing known PAM-4 encoding scheme to an embodiment of the invention for a certain value of bits.

As shown in FIG. 6, which is a graphical representation of the transmission of bitstream "0000000000" for NRZ (601), PAM-4 (602), and an embodiment of the proposed signaling method (603), in signaling systems such as NRZ and PAM signaling, the clock pulse is not necessarily present in every symbol, and the type and value of the transmitted data determine the presence or absence of the clock pulse edge in the transmitted symbol. For example, in unencoded/unscrambled NRZ signaling 601 or PAM-4 signaling 602, if the transmitter sends a constant data value for a period of time (e.g., $10{\times}T_{sym}$) such as sending the logical "0" value 10 times, the output voltage on the transmitter side remains constant during these $10{\times}T_{sym}$ and does not change. Therefore, the receiver has no information about the transmitter's clock pulse during the interval for a period of $10{\times}T_{sym}$, and if a sudden change in the clock pulse edge occurs, the receiver cannot track such a sudden change, which can lead to errors at the receiver side. In an embodiment shown in 603, however, if the transmitter sends constant data for a certain period (e.g., sending the logical "0" value 10 times), a rising or falling edge of the clock pulse can be represented in each symbol. Such rising or falling edges of the clock pulse are indicated with dots (604). Therefore, the receiver can easily and efficiently track the clock pulse status on the transmitter's side and prepare itself for any sudden changes. As a result, the jitter tracking is enhanced on the receiver side and errors caused by jitter on the clock pulse edge are significantly reduced.

In an embodiment, shown in FIG. 3 at 304, the signals $p_1$ and $p_2$ are orthogonal in one symbol period, $T_{sym}$; thus, $$\int_{t_0}^{t_0+T_{sym}} p_1 \times p_2 dt = 0.$$

Exploiting this orthogonality, $x_{odd}$ and $x_{even}$ can be concurrently derived, within the decoder 304, by multiplying the received signal at the decoder's input by $p_2$ and $p_1$, respectively (314), integrating the results over one $T_{sym}$ (315), and passing the output signals through slicers (316). Thus, $x_{even}(r)$ and $x_{odd}(r)$ which are the values of two consecutive bits of the data stream x can be concurrently decoded within one $T_{sym}$, and the presented signaling scheme provides a throughput of 2 bits/symbol.

Figure 7:
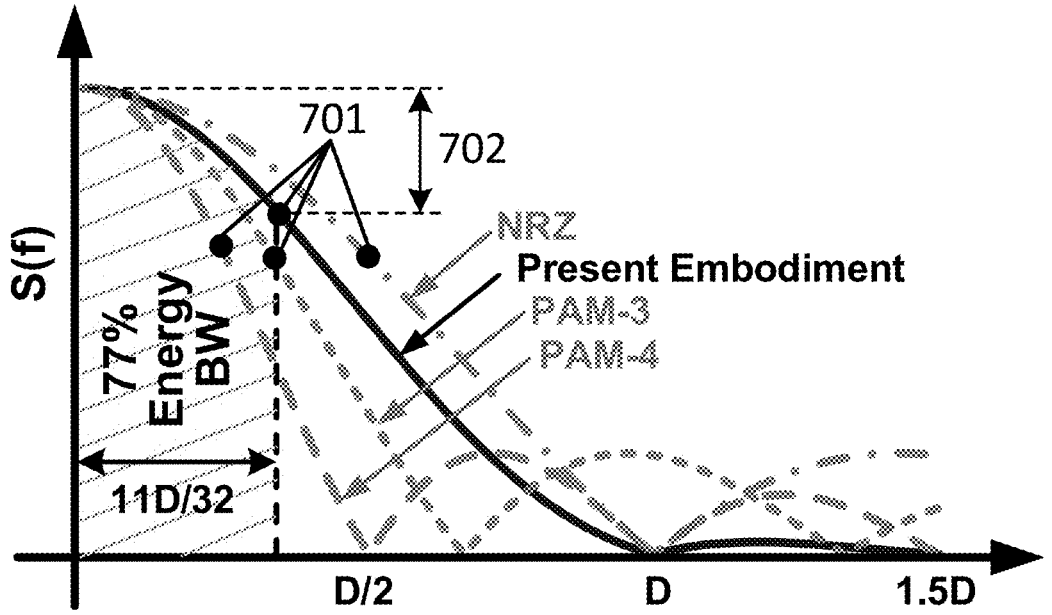
FIG. 7 is a graphical comparative representation of the power spectrum of the proposed signaling scheme shown and compared with known signaling methods, according to an embodiment.

FIG. 7 shows the power spectrum of the proposed signaling scheme (for M=2) compared with other signaling methods, each with a data rate of D, according to an embodiment. Taking the Nyquist frequency into account, disclosed embodiments may have relatively similar spectral efficiencies to, for example, PAM-3 (which is better than NRZ) while maintaining a throughput equal to PAM-4. Thus, compared to PAM-3, disclosed embodiments achieve higher throughput with relatively similar spectral efficiency. Compared to PAM-4, disclosed embodiments are less sensitive to Inter-Symbol Interference (ISI) and Data-Dependent Jitter, resulting in a better Signal-to-Noise Ratio (SNR). The primary reason for this improvement is the lower number of voltage levels that typically are required in the signal encoded pursuant to current embodiments as compared to signals encoded with PAM-4.

Furthermore, as evident from FIG. 7, within the Nyquist frequency range (indicated by circles 701), the decrease in the power of frequency components with increasing frequency in the proposed signaling (indicated by the arrow 702) is less pronounced compared to other signaling methods. Accordingly, in an embodiment, distortion of a signal transmitted through a telecommunication channel (that attenuates high frequencies) will be lower. As a result, the required equalization scheme at the receiver of the proposed signaling is less complex than other signaling methods.

One skilled in the art will further appreciate that, in comparison, for example, to the ENRZ signaling method, the proposed signaling also demonstrates a significantly lower sensitivity to inter-wire skew.

Figure 8:
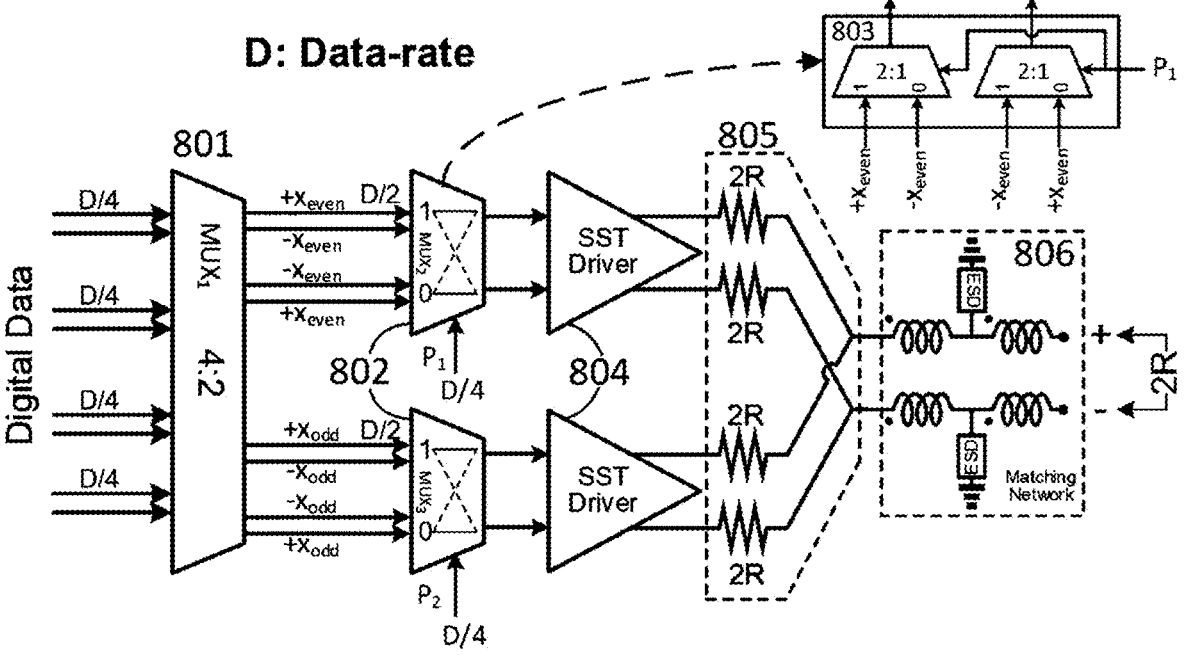
FIG. 8 is a detailed block diagram of the transmitter architecture, according to an embodiment.

Without loss of generality, methods and architectures for implementing embodiments of the signaling with two modulating clock pulse signals are explained in the embodiments that follow. All the discussions and methods can be equally applied to a general case of using M orthogonal modulating clock pulse signals, as represented in FIG. 3. With regard to FIG. 3, within the encoder (303), the data streams $x_{even}$ and $x_{odd}$ are multiplied, respectively, by the clock pulse signals $p_1$ and $p_2$, and the resulting signals are then added. Considering the logical levels of these signals (which can be "−1" or "+1"), the required multiplication operation can be simply realized by changing the polarity of $x_{even}$ and $x_{odd}$ on each rising/falling edge of $p_1$ and $p_2$. This polarity change can be achieved using standard multiplexers. In the block diagram of the proposed transmitter structure in FIG. 8, a 4-to-2 multiplexer ($MUX_1$) 801 splits the input differential bitstream with an aggregate data rate of $D=2/T_{sym}$ into differential data streams $x_{even}$ and $x_{odd}$ with bit rates of D/2. These data streams are then multiplied by orthogonal clock pulse signals $p_1$ and $p_2$ using multiplexers $MUX_2$ and $MUX_3$ (802), respectively. The detailed implementation of these multiplexers is shown in 803. The outputs of $MUX_2$ and $MUX_3$ are fed into source series-terminated (SST) drivers 804 which provide a proper voltage swing at the transmitter's output. SST drivers' outputs are connected together by circuitry 805 which fulfills the required addition operation in Equation 5. In an embodiment, the required output matching is satisfied by circuitry 806 along with 805.

Figure 9:
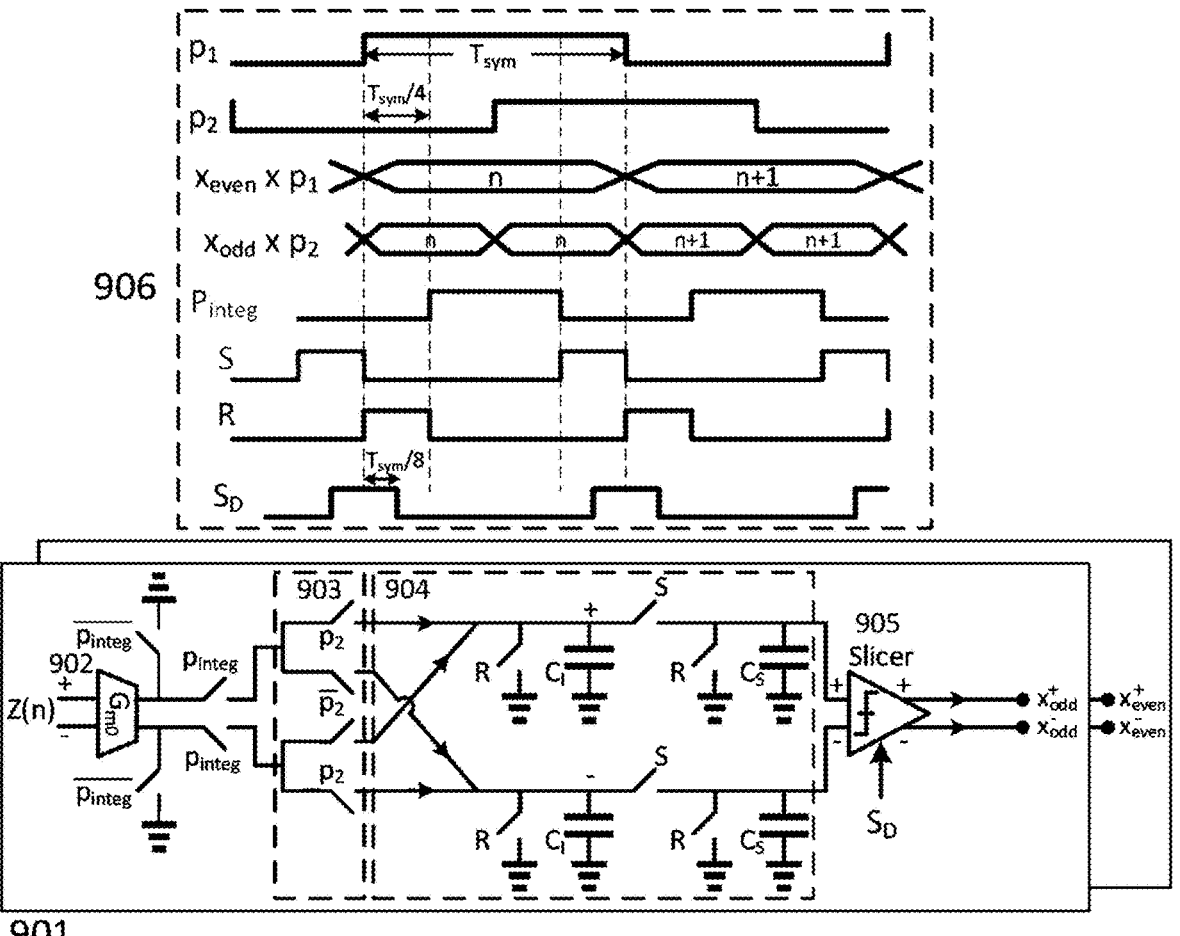
FIG. 9 is a block diagram of decoder architecture, according to an embodiment.

FIG. 9 illustrates a receiver decoder 901, according to an embodiment. In this structure, the input signal z enters a transconductance stage 902, denoted by $G_{m0}$, which converts its input voltage signal into a current signal with a specific amplitude. This output current is switched by modulating clock pulse signal $p_1$ (or $p_2$), thus performing the required multiplying operation 903. The output signal of this multiplier is first fed into a switched-capacitor type integrator 904 and then into a slicer 905. With an appropriate timing for the switching pulses, as graphically represented in 906, the proposed decoder allows for multiplying the received encoded signal by $p_1$ (or $p_2$) and integrating the result on the capacitor $C_I$ over the time interval $p_{integ}$ (which, in an embodiment, has a $0.5T_{sym}$ integration window).

In the utilized timing scheme, the output signal of the integrator is held on the capacitor $C_S$ for a duration of $0.25T_{sym}$, serving as a track & hold function. After each cycle of operation, the integrator and sampler are reset to clear the memory of capacitors $C_I$ and $C_S$. The pulse widths of the control signals $p_{integ}$, S, and R in (906), should be set to $0.5T_{sym}$, $0.25T_{sym}$, and $0.25T_{sym}$, respectively, for the system to operate properly.

Figure 10:
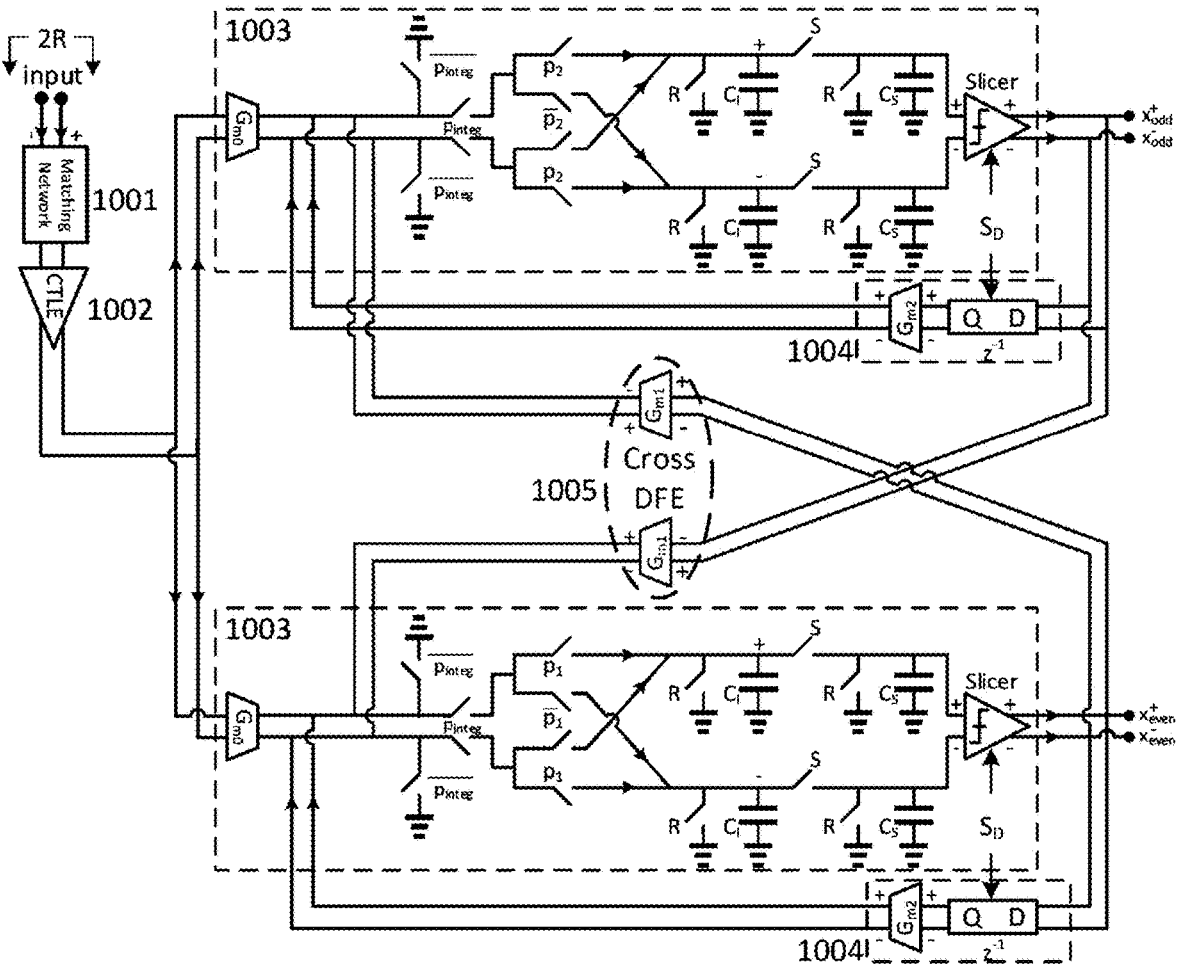
FIG. 10 is a detailed block diagram of the entire receiver architecture, according to an embodiment.

A complete receiver architecture is presented in FIG. 10, according to an embodiment. The signal input to the receiver is first passed through a matching network 1001 and fed into a continuous-time linear equalizer (CTLE) 1002, which partially compensates for the channel response effects. The CTLE's output signal is then split into two different paths that enable decoding of $x_{even}$ and $x_{odd}$ data streams through the decoders 1003 discussed above. To mitigate the effects of intersymbol interference (ISI) caused by the channel, each path employs a Decision Feedback Equalizer (DFE) with a single tap 1004. The DFE within each path is realized by a transconductance stage, $G_{m2}$, converting the recovered $x_{even}$ (or $x_{odd}$) voltage signal to a current signal with a proper weight and feeding the current signal back to the input of the switched capacitor block for post-cursor removal. In the proposed configuration, the cross DFEs 1005 realized by transconductance stages $G_{m1}$ are also considered to compensate for the interference effects of each path on the other path (i.e., cross-talk between $x_{odd}$ and $x_{even}$) that is caused by the channel response and non-idealities on the receiver side (such as orthogonality mismatch between $p_1$ and $p_2$ and duty cycle distortion of $p_{integ}$).

Figure 11:
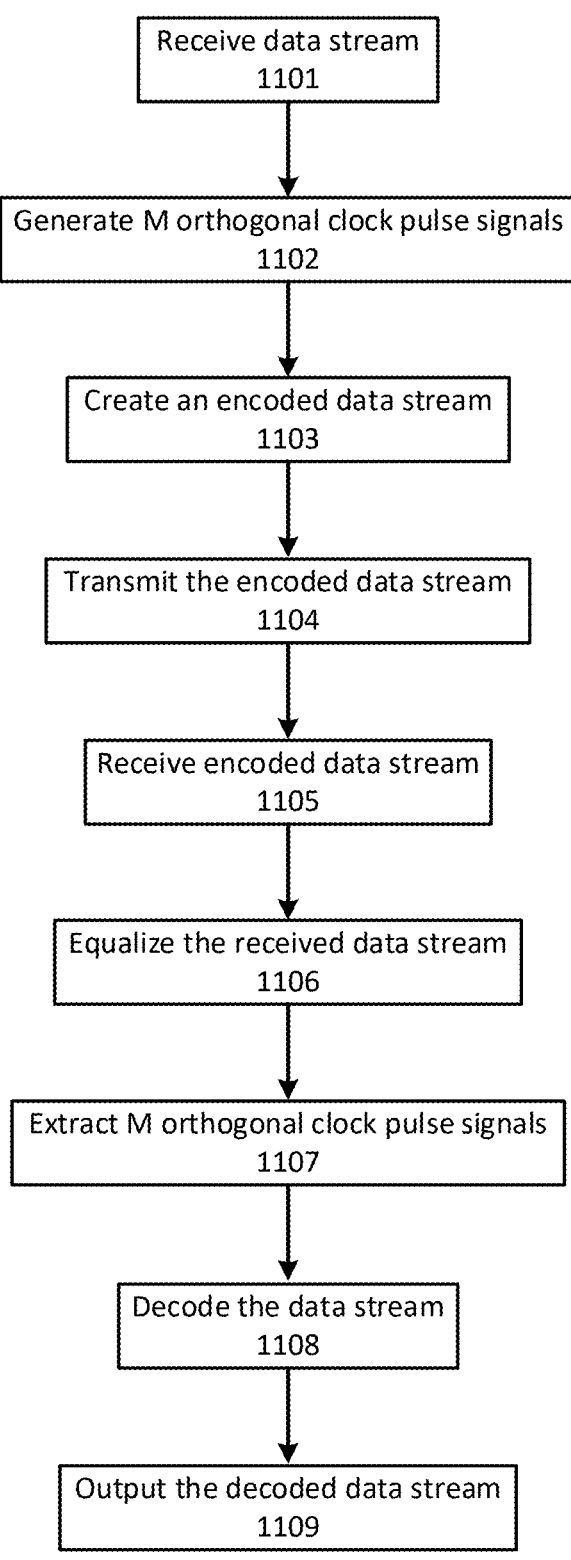
FIG. 11 is a flow chart of a method for encrypting and decrypting a data stream, according to an embodiment.

FIG. 11 is a flow chart of a method for encrypting and decrypting a data stream, according to an embodiment. At 1101, a data stream $x(n)$ is received, the data stream comprising a number M of same-rate data streams. Each data stream in the M same-rate data streams has an ordered number of bits, each with a period of $T_{sym}$ which is M times larger than the bit period of $x(n)$. The data stream received in 1101 also includes a clock pulse signal that is made up of a plurality of pulses, where each pulse in the plurality of pulses has a time duration (pulse width) of $T_{sym}/M$.

At 1102, M clock pulse signals are generated from the clock pulse signal received in the received data stream, each clock pulse signal in the M clock pulse signals having a number of pulses. In an embodiment, each pulse in each clock pulse signal has a logical level of "−1" or "+1." In an embodiment, any two clock pulse signals are orthogonal to one another within a time duration of $T_{sym}$.

At 1103, an encoded data stream is created by multiplying the value of the rth bit of each data stream in the ordered number M of same-rate data streams by the value of the nth pulse of a corresponding pulse signal in the ordered number M of orthogonal clock pulse signals and adding the M results. Once the encoding is done, the encoded data stream is transmitted at 1104. In an embodiment, each bit in the encoded data stream is represented by the equation $$y(n) = \sum_{k=1}^{M} x_k(r) \times p_k(n),$$

where r, representing the bit number for $x_k$ which is kth data stream in the M same-rate data streams, is equal to the integer part of $$\left(\frac{n}{M}\right),$$

and $x_k(r)$ is equal to $x(Mr+k−1)$. $y(n)$ is the value of an encoded nth bit, $x_k(r)$ is the value of an unencoded rth bit in the $x_k$ data stream, and $p_k(n)$ is the value of the nth pulse in the kth modulating clock pulse signal in the M modulating clock pulse signals, and has a logical level of "−1" or "+1".

Once data is encoded and transmitted as an encoded data stream, it is received at a receiver at 1105 and is equalized to compensate for the loss of the wired link at 1106.

Subsequently, M orthogonal clock pulse signals are extracted from the equalized data at 1107. At 1108, the data streams $x_k$, k varying from 1 to M, are decoded using the equation $$x_k(r) = \int_{rT_{sym}}^{(r+1)T_{sym}} z(t) \times p_k(t)\, dt.$$

Once the data streams $x_1, x_2, \ldots,$ and $x_M$ are decoded, the resulting data stream $x(n)$ comprising these M decoded data streams, can be output at 1109.

Modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

I claim:

1. A method for creating and transmitting an encoded data stream comprising:

receiving a data stream comprising an integer number M≥2 of same-rate data streams $x_1$, $x_2, \ldots, x_M$, each data stream in the M same-rate data streams having an ordered number of bits, each bit having a symbol period of Tsym; and a clock pulse signal including a plurality of pulses where a time duration of each pulse in the plurality of pulses corresponds to $T_{sym}/M$;

generating a number M of orthogonal pulse signals, each pulse signal in the M orthogonal pulse signals having an ordered number of pulses, from the clock pulse signal of the received data stream;

creating, from the data stream, an encoded data stream comprising an ordered number of bits, being generated by multiplying each data stream in the M same-rate data streams by a corresponding pulse signal in an ordered number M of orthogonal pulse signals to provide M results, summing the M results; and transmitting the encoded data stream.

2. The method of claim 1, where each pulse in each pulse signal in the M orthogonal pulse signals has a logical value of only "−1" or "+1".

3. The method of claim 2, where any pulse signal in the M of orthogonal pulse signals is orthogonal to any other pulse signal in the M of orthogonal pulse signals within the symbol period of $T_{sym}$.

4. The method of claim 3, where each bit in the encoded data stream is represented by the equation:

$$y(n) = \sum_{k=1}^{M} x_k(r) \times p_k(n),$$

where

M is the number of same-rate data streams;

k is an integer index number within the M number of same-rate data streams;

y(n) is the value of an encoded nth bit;

$x_k(r)$ is the value of an unencoded rth bit in the kth data stream;

$x_k(r)=x(Mr+k−1)$; and $p_k(n)$ is the value of the nth pulse in a kth modulating pulse signal, and has a logical level of only "−1" or "+1" for each value of n.

5. The method of claim 4, further comprising:

receiving the encoded data stream;

extracting the M orthogonal pulse signals from the received encoded data stream; and decoding the unencoded rth bit within an rth symbol period of the M same-rate data streams, concurrently, through multiplying the received encoded data stream at the input of a decoder by the M orthogonal clock pulse signals, where a kth clock pulse signal corresponds to a kth data stream, k varying from 1 to M, and integrating the results over the rth symbol period such that $$x_k(r) = \int_{rT_{sym}}^{(r+1)T_{sym}} z(t) \times p_k(t)\, dt,$$

where z(t) denotes the received encoded data stream at the decoder's input.

6. The method of claim 5, where the received encoded data stream includes at least one encoded symbol, and where extracting the M orthogonal pulse signals comprises:

generating the M orthogonal pulse signals; and aligning at least one of a rising or a falling edge of at least one pulse signal in the generated orthogonal pulse signals with the at least one rising or falling edge of a pulse signal embedded in the received encoded symbols within a predetermined reception period.

7. The method of claim 6, where M=2, and where the generated orthogonal pulse signals are designated $p_1$ and $p_2$, and where each bit in the encoded data stream has a value given by the equation $y(n)=x_{even}(r)\times p_1(n)+x_{odd}(r)\times p_2(n)$ where $x_{even}(r)=x(2r)$ and $x_{odd}(r)=x(2r+1)$ over one symbol period $T_{sym}$, $x_{even}(r)$ is the value of the rth bit in a first data stream, and $x_{odd}(r)$ is the value of the rth bit in a second data stream.

8. The method of claim 7, further comprising:

extracting the two orthogonal pulse signals, $p_1$ and $p_2$, from the received encoded data stream; and decoding the unencoded rth bit of $x_{even}$ by multiplying the received encoded data stream at the decoder's input by clock pulse signal $p_1$, and concurrently decoding the unencoded rth bit of $x_{odd}$ by multiplying the received encoded data stream at the decoder's input by clock pulse signal $p_2$, and integrating the results over the rth symbol period such that $$x_{even}(r) = \int_{rT_{sym}}^{(r+1)T_{sym}} z(t) \times p_1(t)\, dt \text{ and } x_{odd}(r) = \int_{rT_{sym}}^{(r+1)T_{sym}} z(t) \times p_2(t)\, dt,$$

where z(t) denotes the received encoded data stream at the decoder's input;

and outputting the decoded data streams $x_{even}$ and $x_{odd}$ to reproduce unencoded data stream x (n).

9. A method comprising:

encoding data by:

receiving a digital data stream that includes a plurality of even and odd numbered bits, where the digital data stream has a bit period of one half a symbol period $T_{sym}$;

splitting the digital data stream into a first bit data stream and a second bit data stream, where the first bit data stream and the second bit data stream each has a bit period of one symbol period $T_{sym}$, and where each bit in the first bit data stream and the second bit data stream has a voltage value of either zero or one;

assigning a voltage value of "−1" to each bit in the first bit data stream and the second bit data stream that has a voltage value of zero;

generating a first periodic clock pulse signal and a second periodic clock pulse signal with alternating values of "−1" and "+1", each over one symbol period, and where the first periodic clock pulse signal with a period of $2T_{sym}$ is orthogonal to the second periodic clock pulse signal with a period of $2T_{sym}$, within a symbol period $T_{sym}$;

multiplying the first bit data stream by the first modulating clock pulse signal creating a first product;

multiplying the second bit data stream by the second modulating clock pulse signal creating a second product; and summing the first and second product; to create an encoded data stream; and transmitting the encoded data stream.

10. The method of claim 9, further comprising decoding the encoded data stream by:

receiving the encoded data stream;

decoding the received encoded data stream using an inverse operation to the encoding to create a decoded data stream; and outputting the decoded data stream.

11. The method of claim 10, further comprising extracting two orthogonal pulse signals from the received encoded data stream.

12. The method of claim 11, where the two orthogonal pulse signals are embedded in the encoded data stream, and where the extracting of two orthogonal pulse signals comprises:

generating two orthogonal pulse signals; and aligning at least one of a rising or falling edge of at least one pulse signal in the generated orthogonal pulse signals with the at least one rising or falling edge of the pulse signal embedded in the received encoded symbols within a predetermined reception period.

13. An apparatus comprising:

circuitry configured to create and transmit an encoded data stream, including:

an encoder including demultiplexer circuitry configured to:

receive an aggregate transmission of a data stream, the data stream including:

an integer number M≥2 of same-rate data streams, each data stream in the M same-rate data streams having an ordered number of bits; and a clock pulse signal including a plurality of pulses where each pulse in the plurality of pulses corresponds to one bit in the aggregated data stream;

output the M data streams, each data stream in the M data streams having a data rate M times lower than that of the aggregated data stream;

the encoder further including circuitry configured to generate, using the M data streams output by the demultiplexer, a high speed encoded data stream having an ordered number of bits being generated by multiplying a data stream in the ordered number M of same-rate data streams by a corresponding clock pulse signal in the ordered number M of orthogonal clock pulse signals to provide M results, and summing the M results;

the encoder further including circuitry configured to transmit the encoded data stream.

14. The apparatus of claim 13, where each pulse of the clock pulse signals has a logical value of only "−1" or "+1".

15. The apparatus of claim 14, where any two modulating clock pulse signals are orthogonal to one another within a symbol period Tsym.

16. The apparatus of claim 15, where each bit in the encoded data stream is represented by the equation:

$$y(n) = \sum_{k=1}^{M} x_k(r) \times p_k(n),$$

where

M is the number of same-rate data streams;

k is an integer index number within the M number of same-rate data streams;

y(n) is the value of an encoded nth bit;

$x_k(r)$ is the value of an unencoded rth bit in the kth data stream;

$x_k(r)=x(Mr+k−1)$; and $p_k(n)$ is the value of the nth pulse in the kth modulating pulse signal, and has a logical level of only "−1" or "+1" for each value of n.

17. The apparatus of claim 16, where M=2, and where each bit in the encoded data stream has a value given by the equation $y(n)=x_{even}(r) \times p_1(n)+x_{odd}(r) \times p_2(n)$, where $x_{even}(r)=x(2r)$ and $x_{odd}(r)=x(2r+1)$, and $x_{even}(r)$ is the value of the rth bit in a first data stream, and $x_{odd}(r)$ is the value of the rth bit in a second data stream.

18. The apparatus of claim 13, further comprising decoder circuitry configured to decode the encoded data stream, the decoder circuitry including circuitry configured to:

receive the encoded data stream, the encoded data stream comprising M orthogonal clock pulse signals $p_k$, k varying from 1 to M;

extract the M orthogonal clock pulse signals $p_k$ from the received encoded data stream; and decode an rth bit of M data streams $x_1, x_2, \ldots,$ and $x_M$, concurrently, performed by multiplying the received encoded data stream, by $p_1$, $p_2, \ldots,$ and $p_M$, respectively, and integrating the results over an rth symbol period $T_{sym}$ such that $$x_k(r) = \int_{rT_{sym}}^{(r+1)T_{sym}} z(t) \times p_k(t)\, dt.$$

where z(t) denotes the received encoded data stream.

19. The apparatus of claim 18, where said extracting the M orthogonal clock pulse signals comprises:

generating M orthogonal clock pulse signals, each clock pulse signal having a rising edge and a falling edge; and aligning at least one of a rising or falling edge of at least one pulse signal in the generated M orthogonal pulse signals with at least one of a rising or falling edge of a pulse signal embedded in the received encoded symbols within a predetermined reception period.

20. The apparatus of claim 19, where M=2, further comprising circuitry to:

extract the two orthogonal clock pulse signals, $p_1$ and $p_2$, from the received encoded data stream; and decode the rth bit of $x_{even}$ and $x_{odd}$, concurrently, by multiplying the received encoded data stream, z, by clock pulse signal $p_1$, to detect $x_{even}$, and $p_2$, to detect $x_{odd}$, and integrating the results over the rth symbol period $T_{sym}$ satisfying the equations $$x_{even}(r) = \int_{rT_{sym}}^{(r+1)T_{sym}} z(t) \times p_1(t)\, dt \text{ and}$$

$$x_{odd}(r) = \int_{rT_{sym}}^{(r+1)T_{sym}} z(t) \times p_2(t)\, dt, \text{ and}$$

output the decoded data streams $x_{even}$ and $x_{odd}$ to reproduce unencoded the data stream received at the demultiplexer circuitry.

\* \* \* \* \*